(12) United States Patent
Sundgren (10) Patent No.: US 11,145,783 B2
(45) Date of Patent: Oct. 12, 2021

(54) OPTOELECTRONIC SEMICONDUCTOR COMPONENT, AND METHOD FOR PRODUCING AN OPTOELECTRONIC SEMICONDUCTOR COMPONENT

(71) Applicant: OSRAM OLED GmbH, Regensburg (DE)

(72) Inventor: Petrus Sundgren, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/762,272

(22) PCT Filed: Nov. 5, 2018

(86) PCT No.: PCT/EP2018/080113
§ 371 (c)(1),
(2) Date: May 7, 2020

(87) PCT Pub. No.: WO2019/091895
PCT Pub. Date: May 16, 2019

(65) Prior Publication Data
US 2020/0357949 A1    Nov. 12, 2020

(30) Foreign Application Priority Data
Nov. 10, 2017    (DE) .......................... 102017126446.9

(51) Int. Cl.
*H01L 33/14*    (2010.01)
*H01L 33/44*    (2010.01)
*H01L 33/00*    (2010.01)

(52) U.S. Cl.
CPC .......... *H01L 33/0016* (2013.01); *H01L 33/14* (2013.01); *H01L 33/44* (2013.01)

(58) Field of Classification Search
CPC ...... H01L 33/0016; H01L 33/14; H01L 33/44
See application file for complete search history.

(56) References Cited

U.S. PATENT DOCUMENTS

| 4,719,632 A | * | 1/1988 | Lindsey | ................ H01S 5/0014 |
| | | | | 372/45.01 |
| 4,956,683 A | | 9/1990 | Quintana | |

(Continued)

FOREIGN PATENT DOCUMENTS

| DE | 2414778 A1 | 10/1975 |
| DE | 102015111493 A1 | 1/2017 |
| EP | 0487192 A2 | 5/1992 |

OTHER PUBLICATIONS

International Search Report and Written Opinion in corresponding International Application No. PCT/EP2018/080113 dated Feb. 13, 2019, 12 pages.

*Primary Examiner* — Mark W Tornow
(74) *Attorney, Agent, or Firm* — MH2 Technology Law Group LLP (57) ABSTRACT

An optoelectronic semiconductor component is specified which comprises a semiconductor layer sequence having a first and a second semiconductor layer of a first conductivity type, an active layer designed for generating electromagnetic radiation, a first electrical terminal layer and a second electrical terminal layer laterally spaced therefrom which electrically contacts the second semiconductor layer, and a first contact zone of a second conductivity type which adjoins the first electrical terminal layer and is electrically conductively connected to the first electrical terminal layer. And at least one functional region formed between the first and second terminal layers, in which a second contact zone of a second conductivity type and at least one shielding zone of a second conductivity type is formed.

Furthermore, a method for producing the optoelectronic semiconductor component is specified.

17 Claims, 7 Drawing Sheets

(56) References Cited

U.S. PATENT DOCUMENTS

| | | | | |
|---|---|---|---|---|
| 5,216,263 | A * | 6/1993 | Paoli | H01S 5/423 257/88 |
| 5,804,461 | A * | 9/1998 | Beyea | H01S 5/0021 438/45 |
| 6,215,132 | B1 * | 4/2001 | Nettelbladt | H01L 21/2654 257/93 |
| 8,823,024 | B2 * | 9/2014 | Engl | H01L 33/382 257/93 |

* cited by examiner

OPTOELECTRONIC SEMICONDUCTOR COMPONENT, AND METHOD FOR PRODUCING AN OPTOELECTRONIC SEMICONDUCTOR COMPONENT

CROSS-REFERENCE TO RELATED APPLICATION(S)

This patent application is a national stage entry from International Application No. PCT/EP2018/080113, filed on Nov. 5, 2018, published as International Publication No. WO 2019/091895 A1 on May 16, 2019, and claims priority under 35 U.S.C. § 119 from German patent application 10 2017 126 446.9, filed Nov. 10, 2017, the entire contents of all of which are incorporated herein by reference.

An optoelectronic semiconductor component and a method for producing an optoelectronic semiconductor component are specified. The optoelectronic semiconductor component may in particular be a radiation-emitting optoelectronic component which, in operation, emits electromagnetic radiation, for example light.

One task to be solved is to specify an optoelectronic semiconductor component which has an improved efficiency.

Another task is to specify a method for producing such an optoelectronic semiconductor component.

According to at least one embodiment of the optoelectronic semiconductor component, the optoelectronic semiconductor component comprises a semiconductor layer sequence having a first semiconductor layer of a first conductivity type, a second semiconductor layer of the first conductivity type and an active layer designed for generating electromagnetic radiation. The active layer is arranged between the first semiconductor layer and the second semiconductor layer. The semiconductor layers are preferably epitaxially grown. The active layer preferably comprises a pn junction, a double heterostructure, a single quantum well (SQW) or, particularly preferably, a multiple quantum well (MQW) structure for generating radiation.

According to at least one embodiment of the optoelectronic semiconductor component, the optoelectronic semiconductor component comprises a first electrical terminal layer and a second electrical terminal layer laterally spaced from the first electrical terminal layer and electrically contacting the second semiconductor layer. The term "contact" is understood here to mean that the relevant terminal layer directly or indirectly adjoins the second semiconductor layer at least in some areas and is electrically connected to the second semiconductor layer, preferably forming an ohmic contact. The first electrical terminal layer and the second electrical terminal layer are formed, for example, with a metal, a metal alloy or a conductive transparent oxide and are used for the electrical contacting of the optoelectronic semiconductor component.

According to at least one embodiment of the optoelectronic semiconductor component, the optoelectronic semiconductor component comprises a first contact zone of a second conductivity type which adjoins the first electrical terminal layer and is electrically conductively connected to the first electrical terminal layer. The first contact zone may, for example, have a p-type conductivity and be provided for the injection of holes. In particular, the first contact zone can form an electrically conductive contact path from the first electrical terminal layer to the active layer.

According to at least one embodiment of the optoelectronic semiconductor component, the optoelectronic semiconductor component comprises at least one functional region formed between the first electrical terminal layer and the second electrical terminal layer, in which a second contact zone of a second conductivity type and at least one shielding zone of a second conductivity type are formed, the second contact zone adjoining an electrical connection layer and being electrically conductively connected to the electrical connection layer. The electrical connection layer is arranged outside the semiconductor layer sequence and contacts the second semiconductor layer in an electrical connection region. This means that the electrical connection layer directly or indirectly adjoins the second semiconductor layer at least in certain areas and is electrically connected to the second semiconductor layer, preferably forming an ohmic contact. The electrical connection layer thus provides an electrically conductive path between the electrical connection region and the second contact zone.

The shielding zone is located between the second contact zone and the electrical connection region and is electrically insulated from the electrical connection layer. The shielding zone is used, for example, to shield charge carriers between the first contact zone and the electrical connection region so that a flow of charge carriers between the first contact zone and the electrical connection region is suppressed within the semiconductor layer sequence. This results in a series connection of second electrical terminal layer, second contact zone, electrical connection region, first contact zone and first electrical terminal layer. This causes a double injection of charge carriers for radiation generation into the active layer, on one hand in the region between the first electrical terminal layer and the electrical connection region, and on the other hand in the region between the second contact zone and the second electrical terminal layer.

According to at least one embodiment of the optoelectronic semiconductor component, the first contact zone, the second contact zone and the shielding zone extend from the second semiconductor layer to the first semiconductor layer and penetrate the active layer completely.

According to at least one embodiment, the optoelectronic semiconductor component comprises,
- a semiconductor layer sequence having a first semiconductor layer of a first conductivity type, a second semiconductor layer of the first conductivity type and an active layer designed for generating electromagnetic radiation, wherein the active layer is arranged between the first semiconductor layer and the second semiconductor layer,
- a first electrical terminal layer and a second electrical terminal layer laterally spaced from the first electrical terminal layer and electrically contacting the second semiconductor layer,
- a first contact zone of a second conductivity type adjacent to the first electrical terminal layer and electrically conductively connected to the first electrical terminal layer,
- at least one functional region formed between the first electrical terminal layer and the second electrical terminal layer, in which a second contact zone of a second conductivity type and at least one shielding zone of a second conductivity type are formed, wherein
  - the second contact zone is adjacent to an electrical connection layer and is electrically connected to the electrical connection layer,
  - the electrical connection layer extends outside the semiconductor layer sequence and contacts the second semiconductor layer in an electrical connection region, and the shielding zone is arranged between the second contact zone and the electrical connection region and is electrically insulated from the electrical connection layer, and wherein the first contact zone, the second contact zone and the shielding zone extend from the second semiconductor layer to the first semiconductor layer and completely penetrate the active layer.

One of the considerations underlying an optoelectronic semiconductor component described here is that, in order to increase the efficiency of the optoelectronic semiconductor component, it is advantageous to increase the operating voltage by connecting several pn junctions in series. A plurality of pn junctions is provided for this purpose, preferably on a common substrate. A separation of several pn junctions for their serial connection can be achieved by means of a structuring by etching trenches along the boundaries of adjacent pn junctions. However, this has the disadvantage that many open edges are created in the semiconductor layer sequence, which promote non-radiative recombination processes and thus reduce the overall efficiency of the semiconductor device. A passivation of these edges proves to be difficult to realize from a process engineering point of view.

The optoelectronic semiconductor component described here makes use of the idea of separating the pn junctions by means of one or more shielding zones. A shielding zone is essentially formed by a doped region that represents a charge carrier barrier. This is advantageous in avoiding structuring by etching trenches and introducing sources for non-radiative recombination.

According to at least one embodiment of the optoelectronic semiconductor component, the shielding zone reduces a flow of charge carriers within the semiconductor layer sequence in lateral direction. The lateral direction extends within the main extension plane of the semiconductor layer sequence between the first electrical terminal layer and the second electrical terminal layer. A space-charge region is formed by the shielding zone, which hinders the flow of charge carriers in lateral direction. Furthermore, the valence band edge of the active layer is increased at the location of the shielding zone due to the disturbance of the quantum wells, which further enhances the shielding effect.

According to at least one embodiment of the optoelectronic semiconductor component, a lightly doped second contact layer of the first conductivity type is arranged between the second semiconductor layer and the first electrical terminal layer and/or between the second semiconductor layer and the electrical connection layer. The second contact layer is particularly important for the electrically conductive transition from the first electrical terminal layer to the first contact zone and from the electrical connection layer to the second contact zone.

According to at least one embodiment of the optoelectronic semiconductor component, at least one semiconductor layer of the semiconductor layer sequence is based on a phosphide compound semiconductor material. "Based on phosphide compound semiconductor material" means in this context that the semiconductor layer sequence or at least a part thereof, particularly preferably at least the active layer and/or the growth substrate wafer, preferably comprise $Al_nGa_mIn_{1-n-m}P$ or $As_nGa_mIn_{1-n-m}P$, wherein $0 \leq n \leq 1$, $0 \leq m \leq 1$ and $n+m \leq 1$. This material does not necessarily have to have a mathematically exact composition according to the above formula. Rather, it may comprise one or more dopants and additional components. For simplicity's sake, however, the above formula only includes the essential components of the crystal lattice (Al or As, Ga, In, P), even though these may be partially replaced by small amounts of other substances.

According to at least one embodiment of the optoelectronic semiconductor component, at least one semiconductor layer of the semiconductor layer sequence is based on an arsenide compound semiconductor material. "Based on arsenide compound semiconductor material" means in this context that the semiconductor layer sequence or at least a part thereof, particularly preferably at least the active layer and/or the growth substrate wafer, preferably comprise $Al_nGa_mIn_{1-n-m}As$, wherein $0 \leq n \leq 1$, $0 \leq m \leq 1$ and $n+m \leq 1$. This material does not necessarily have to have a mathematically exact composition according to the above formula. Rather, it may comprise one or more dopants and additional components. For simplicity's sake, however, the above formula only includes the essential components of the crystal lattice (Al or As, Ga, In), even though these may be partially replaced by small amounts of other substances.

According to at least one embodiment of the optoelectronic semiconductor component, the first conductivity type is produced by n-doping with silicon, tellurium and/or tin.

According to at least one embodiment of the optoelectronic semiconductor component, the second conductivity type is produced by p-doping with magnesium and/or zinc. The zinc concentration is preferably in a range from $1 \times 10^{17}$ atoms per cubic centimeter inclusive to $5 \times 10^{19}$ atoms per cubic centimeter inclusive and further preferably in a range from $1 \times 10^{18}$ atoms per cubic centimeter inclusive to $1 \times 10^{19}$ atoms per cubic centimeter inclusive. The concentration of the p-type dopant must be selected so that the conductivity is sufficiently high to inject the holes into the active layer.

According to at least one embodiment of the optoelectronic semiconductor component, the side of the first semiconductor layer remote from the active layer has a roughened or structured surface. A roughened or structured surface improves in particular the extraction efficiency of the first semiconductor layer by reducing total reflection at the interface between the first semiconductor layer and the vicinity. This total reflection, in conjunction with several parallel interfaces, can lead to a continued reflection of the generated radiation within the semiconductor layer sequence instead of an extraction, which is known as "waveguide effect".

According to at least one embodiment of the optoelectronic semiconductor component, the side of the first semiconductor layer remote from the active layer is free of electrical terminal layers. This advantageously creates an uninterrupted surface for extracting the generated radiation on the side opposite the electrical terminals.

According to at least one embodiment of the optoelectronic semiconductor component, a recess which extends from the second semiconductor layer in the direction of the first semiconductor layer, completely penetrates the active layer, is arranged between the second contact zone and the connection region and is filled with a dielectric. The dielectric can be, for example, a silicon oxide or a silicon nitride. The recess serves in particular to improve the extraction of the electromagnetic radiation generated in the active layer by reducing the waveguide effect.

Preferably, the recess tapers from the second semiconductor layer towards the first semiconductor layer. The total reflection at the refractive index jump between the material of the semiconductor layer sequence and the dielectric layer arranged in the recess is used to reflect the electromagnetic radiation generated in the active layer at an interface that is inclined to the extraction surface. A further improvement in the reflectivity of the recess is achieved by an additional arrangement of metal on the dielectric layer. For example, the metal of the electrical connection layer can protrude into the recess.

According to at least one embodiment of the optoelectronic semiconductor component, the recess is arranged completely within the shielding zone. By arranging the recess within the shielding zone, non-radiative recombination at the parts of the outer wall of the recess penetrating the active layer can be advantageously avoided.

According to at least one embodiment of the optoelectronic semiconductor component, a plurality of recesses are arranged in the lateral direction between the second contact zone and the connection region. The waveguide effect can be further reduced by a plurality of recesses, thus improving the optical efficiency of the optoelectronic semiconductor component.

According to at least one embodiment of the optoelectronic semiconductor component, several shielding zones are formed within a functional region. The shielding zones are arranged laterally side by side between the second contact zone and the electrical connection region. By increasing the number of shielding zones, leakage currents occurring within the semiconductor layer sequence can be reduced. The plurality of shielding zones can also be provided with a plurality of recesses, each recess being located within each shielding zone.

According to at least one embodiment of the optoelectronic semiconductor component, a plurality of functional regions are formed in lateral sequence between the first electrical terminal layer and the second electrical terminal layer according to one of the preceding claims. The functional regions may, but do not necessarily have to be identical. In other words, different functional regions according to different preceding claims may be formed together in one optoelectronic semiconductor component. The arrangement of the functional regions in lateral direction corresponds to an electrical series connection. This makes it possible to use a higher operating voltage for the optoelectronic semiconductor component. This results in advantageous optoelectronic semiconductor components in which, for example, a voltage converter can be dispensed with completely, or in which it is possible to use a more efficient voltage converter, since only a smaller voltage difference needs to be bridged. Furthermore, it is thus possible to match the supply voltage of such semiconductor components based on materials with different band gaps. This results in advantageous circuit design possibilities without the need to adapt the different operating voltages.

According to at least one embodiment of the method for producing an optoelectronic semiconductor component, the method comprises the following steps:

A) providing a growth substrate.

B) growing a semiconductor layer sequence comprising a first semiconductor layer, a second semiconductor layer and an active layer designed for generating electromagnetic radiation.

C) introducing a first contact zone, a second contact zone and at least one shielding zone into the semiconductor layer sequence.

D) arranging an electrically insulating layer on the side of the second semiconductor layer remote from the active layer.

E) arranging a first electrical terminal layer, a second electrical terminal layer and an electrical connection layer on the side of the electrically insulating layer remote from the active layer.

F) roughening the side of the first semiconductor layer remote from the active layer.

In accordance with at least one embodiment of the method for producing an optoelectronic semiconductor component, step C) is carried out only after step B). In step C) preferably a diffusion or an ion implantation is provided for introducing the first contact zone, the second contact zone and the shielding zone into the semiconductor layer sequence.

In accordance with at least one embodiment of the method for producing an optoelectronic semiconductor component, the semiconductor layer sequence is applied to a carrier on a side remote from the growth substrate and the growth substrate is detached. The removal of the growth substrate is carried out by means of a laser lift-off process, for example.

Further advantages and advantageous designs and further embodiments of the optoelectronic semiconductor component result from the following exemplary embodiments shown in connection with the figures.

Showing in.

Identical, similar or equivalent elements are marked with the same reference signs in the figures. The figures and the proportions of the elements shown in the figures are not to be regarded as true to scale. Rather, individual elements may be oversized for better representability and/or for better comprehensibility.

Figure 1A:
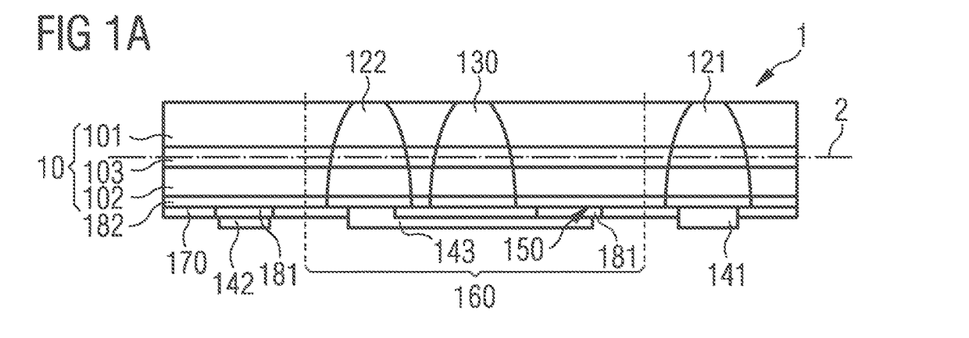
FIG. 1A a schematic cross-section of an optoelectronic semiconductor component according to a first exemplary embodiment, FIG. 1B a band edge of an optoelectronic semiconductor component according to the first exemplary embodiment, FIG. 1C a schematic diagram of a top view of the bottom side of an optoelectronic semiconductor component according to the first exemplary embodiment, FIG. 2A a schematic cross-section of an optoelectronic semiconductor component according to a second exemplary embodiment, FIG. 2B a band edge of an optoelectronic semiconductor component according to the second exemplary embodiment, FIG. 2C a schematic diagram of a top view of the bottom side of an optoelectronic semiconductor component according to the second exemplary embodiment, FIG. 3A a schematic cross-section of an optoelectronic semiconductor component according to a third exemplary embodiment, FIG. 3B a schematic diagram of a top view of the bottom side of an optoelectronic semiconductor component according to the third exemplary embodiment, FIG. 4A a schematic cross-section of an optoelectronic semiconductor component according to a fourth exemplary embodiment, FIG. 4B a band edge of an optoelectronic semiconductor component according to the fourth exemplary embodiment, FIG. 5 a schematic cross-section of an optoelectronic semiconductor component according to a fifth exemplary embodiment, FIG. 6 a schematic cross-section of an optoelectronic semiconductor component according to a sixth exemplary embodiment, FIG. 7 a schematic cross-section of an optoelectronic semiconductor component according to a seventh exemplary embodiment, FIG. 8 a schematic cross-section of an optoelectronic semiconductor component according to an eighth exemplary embodiment, and FIG. 9 a schematic diagram of a possible circuit layout according to a ninth exemplary embodiment.

FIG. 1A shows a first exemplary embodiment of an optoelectronic semiconductor component 1 with a cut line 2. The optoelectronic semiconductor component 1 comprises a semiconductor layer sequence 10 with a first semiconductor layer 101, a second semiconductor layer 102 and an active layer 103. The active layer 103 is arranged between the first semiconductor layer 101 and the second semiconductor layer 102. The semiconductor layers are preferably epitaxially grown on top of each other. The first semiconductor layer and the second semiconductor layer are n-doped with for example silicon, tellurium or tin and are based on a gallium arsenide compound semiconductor material. Due to the composition of the compound semiconductor materials, a larger band gap results for the first semiconductor layer 121 and the second semiconductor layer 122 than for the active layer 103, whereby an inclusion of the charge carriers in the active layer 103 can be advantageously achieved.

A weakly n-doped second contact layer 182 is arranged on the side remote from the active layer 103. On the side of the second contact layer 182 remote from the active layer 103, an electrically insulating layer 170 follows. The electrically insulating layer 170 can be formed with a silicon oxide or a silicon nitride, for example.

Inside the optoelectronic semiconductor component 1A, a first contact zone 121, a second contact zone 122 and a shielding zone 130 are arranged, which are formed by p-doping with zinc and which extend from the contact layer 180 to the first semiconductor layer 101 and penetrate the active layer 103 completely.

For the electrical contacting of the optoelectronic semiconductor component 1, a first electrical terminal layer 141, which completely penetrates the electrically insulating layer 170, and a first contact layer 181 with a second electrical terminal layer 142 are arranged on the side of the second contact layer 182 remote from the active layer 103. The first contact layer 181 is formed with a highly n-doped indium gallium aluminium phosphide semiconductor material, completely penetrates the electrically insulating layer 170 and is arranged between the contact layer 180 and the second electrical terminal layer 142. The second electrical terminal layer 142 provides the electrical contact to the second semiconductor layer 102, and the first electrical terminal layer 141 provides an electrically conductive path for injecting holes into the active layer 103 via the first contact zone 121.

Between the first contact zone 121 and the shielding zone 130, a further highly n-doped first contact layer 181 is arranged, which completely penetrates the electrically insulating layer 170 and thus forms an electrical connection region 150. The electrical connection region 150 and the second contact zone 122 are electrically conductively connected by means of an electrical connection layer 143 arranged on the side of the electrically insulating layer 170 remote from the active layer 103. The electrical connection layer 143 penetrates the electrically insulating layer 170 to contact the second contact zone 122 and is insulated from the shielding zone 130 by the electrically insulating layer 170.

The shielding zone 130 prevents a direct flow of charge carriers in the lateral direction between the electrical connection region 150 and the second contact zone 122. Thus a pn junction in the lateral direction is created between the first contact zone 121 and the electrical connection region 150 and between the second contact zone 122 and the second electrical terminal layer 142, at which a radiative recombination of charge carriers is possible.

The shielding zone 130, the second contact zone 122, the electrical connection region 150, a first contact layer 181 and the electrical connection layer 143 can be combined to form a functional region 160. If the functional region 160 is repeated several times in lateral sequence, a further pn junction, where radiative recombination of charge carriers is possible, is created with each repetition. This corresponds to a series connection of the pn junctions, so that the voltage drops across the pn junctions add up. In this way it is possible to produce an optoelectronic semiconductor component 1 for an advantageously high supply voltage, so that, for example, a voltage converter for its operation can be dispensed with.

Figure 1B:
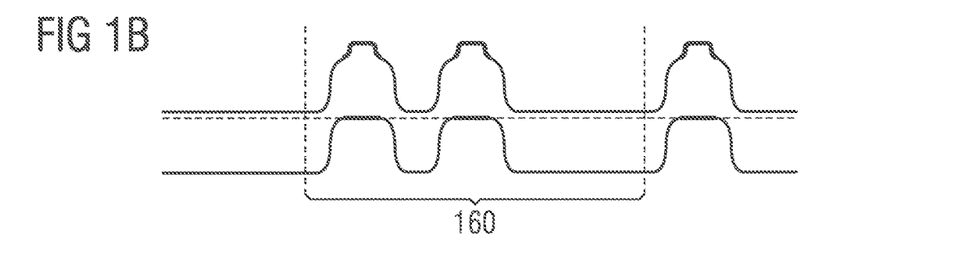

FIG. 1B shows a band edge of an optoelectronic semiconductor component 1 according to the first exemplary embodiment. The first examplary embodiment concerns the optoelectronic semiconductor component in a currentless state, measured at the cut line 2 shown in FIG. 1A. The scale in the lateral direction of FIG. 1A corresponds to the scale in the lateral direction of FIG. 1B. In the absence of external voltage, a flat course of the band edges can be seen, with disturbances at the points of the first contact zone 121, the second contact zone 122 and the shielding zone 130. Small elevations of the energy band edges within the shielding zone 130, the first contact zone 121 and within the second contact zone 122 can be seen in the conduction bands, which are caused by disturbance of the quantum well structures (so-called quantum well intermixing).

Figure 1C:
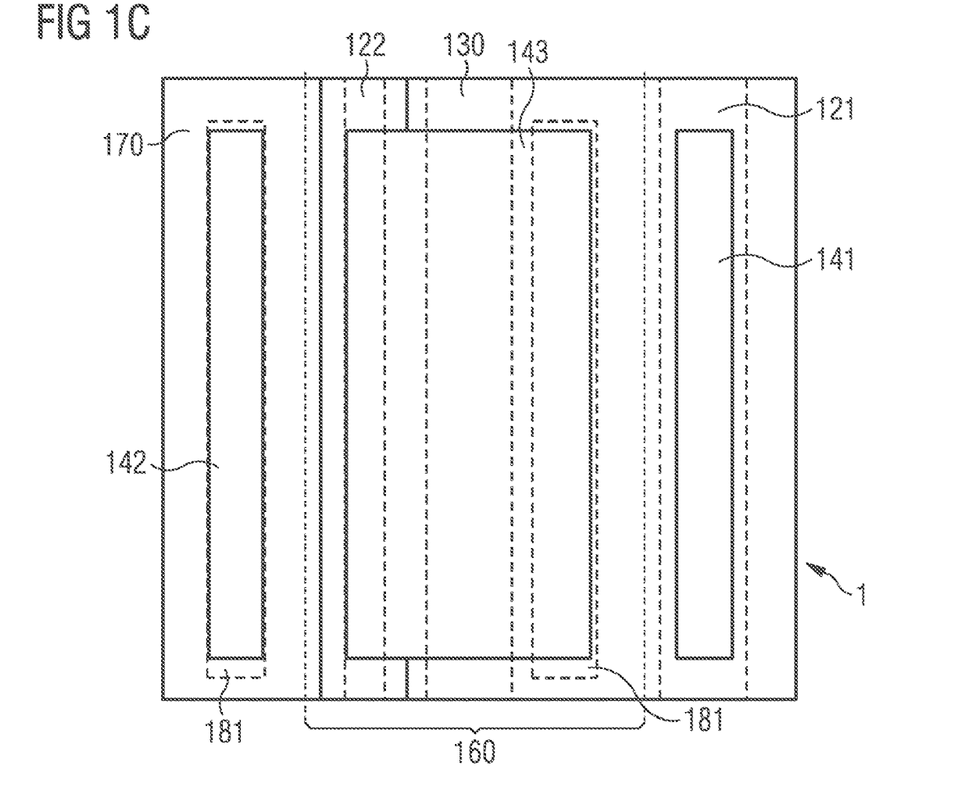

FIG. 1C shows a schematic diagram of a top view of the bottom side of an optoelectronic semiconductor component according to the first exemplary embodiment. The scale in the lateral direction corresponds to the scale in the lateral direction of FIGS. 1A and 1B. The plan view of the bottom surface of the optoelectronic semiconductor component 1 comprises the electrically insulating layer 170, the second contact zone 122, the shielding zone 130, the first contact zone 121, the first contact layer 181, the second electrical terminal layer 142 and the first electrical terminal layer 141. The different hatching makes it clear that the shielding zone 130 is not in any contact with the electrical connection layer 143.

Figure 2A:
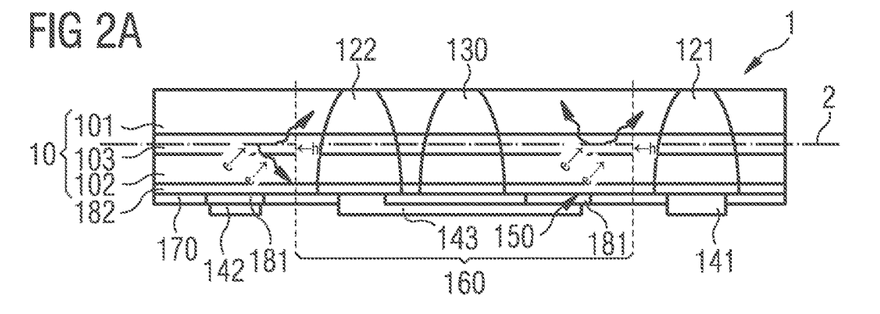

FIG. 2A shows a second exemplary embodiment of an optoelectronic semiconductor component 1 with a cut line 2. The second exemplary embodiment corresponds to the first exemplary embodiment except for the different operating state. The optoelectronic semiconductor component shown here is connected to a supply voltage via the first electrical terminal layer 141 and the second electrical terminal layer 142. This produces a charge carrier current which leads to a radiative recombination of the charge carriers between the second electrical terminal layer 142 and the second contact zone 122 and between the first contact zone 121 and the electrical connection region 150.

Figure 2B:
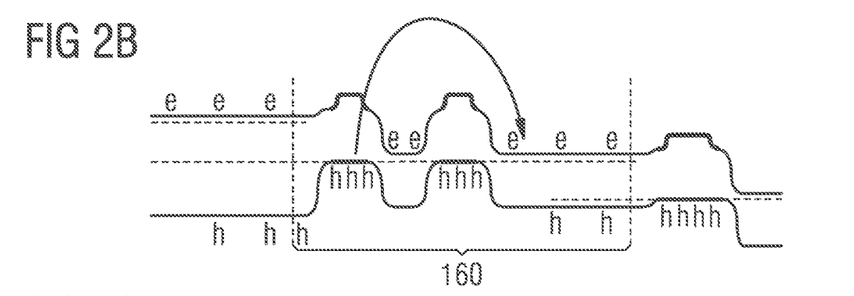

FIG. 2B shows a band edge of an optoelectronic semiconductor component 1 according to the second exemplary embodiment, measured at the cut line 2 shown in FIG. 2A. The scale in the lateral direction of FIG. 2A corresponds to the scale in the lateral direction of FIG. 2B. In the energized state, a band bending is visible. It can also be seen that the increase in the valence band and the conduction band level through the shielding zone 130 acts as a charge carrier barrier for the electrons e and the holes h. The arrow starting from the second contact zone 122 symbolizes the electrically conductive path between the second contact zone 122 and the electrical connection region 150, which is established by the electrical connection layer 143.

Figure 2C:
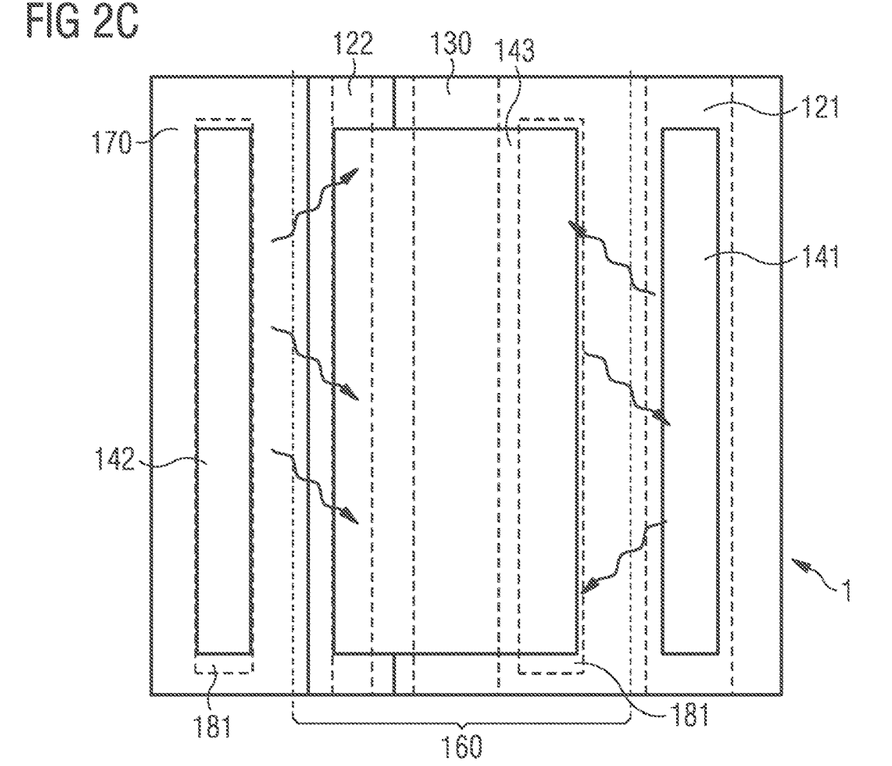

FIG. 2C shows a schematic diagram of a top view of the bottom of an optoelectronic semiconductor component 1 according to the second exemplary embodiment. The scale in the lateral direction corresponds to the scale in the lateral direction of FIGS. 2A and 2B. This exemplary embodiment corresponds essentially to the first exemplary embodiment, except for the radiative recombination of charge carriers between the first contact zone 121 and the electrical connection region 150 and between the second contact zone 122 and the second electrical terminal layer 142 indicated by the arrows.

Figure 3A:
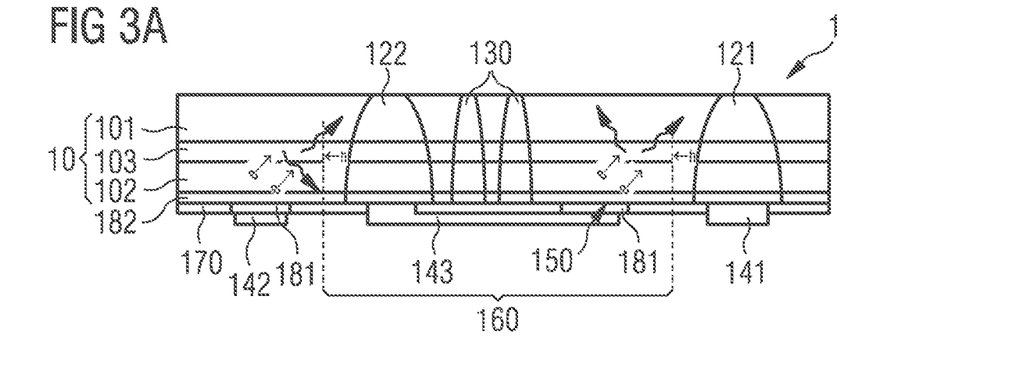

FIG. 3A shows a third exemplary embodiment of an optoelectronic semiconductor component 1. The third exemplary embodiment essentially corresponds to the second exemplary embodiment except for the shape of the shielding zone 130. In addition to a first shielding zone 130, a second shielding zone 130 is located between the second contact zone 122 and the electrical connection region 150 laterally spaced from the first shielding zone 130. A plurality of shielding zones can advantageously increase the shielding effectiveness and thus advantageously reduce leakage currents to increase the efficiency of the device.

Figure 3B:
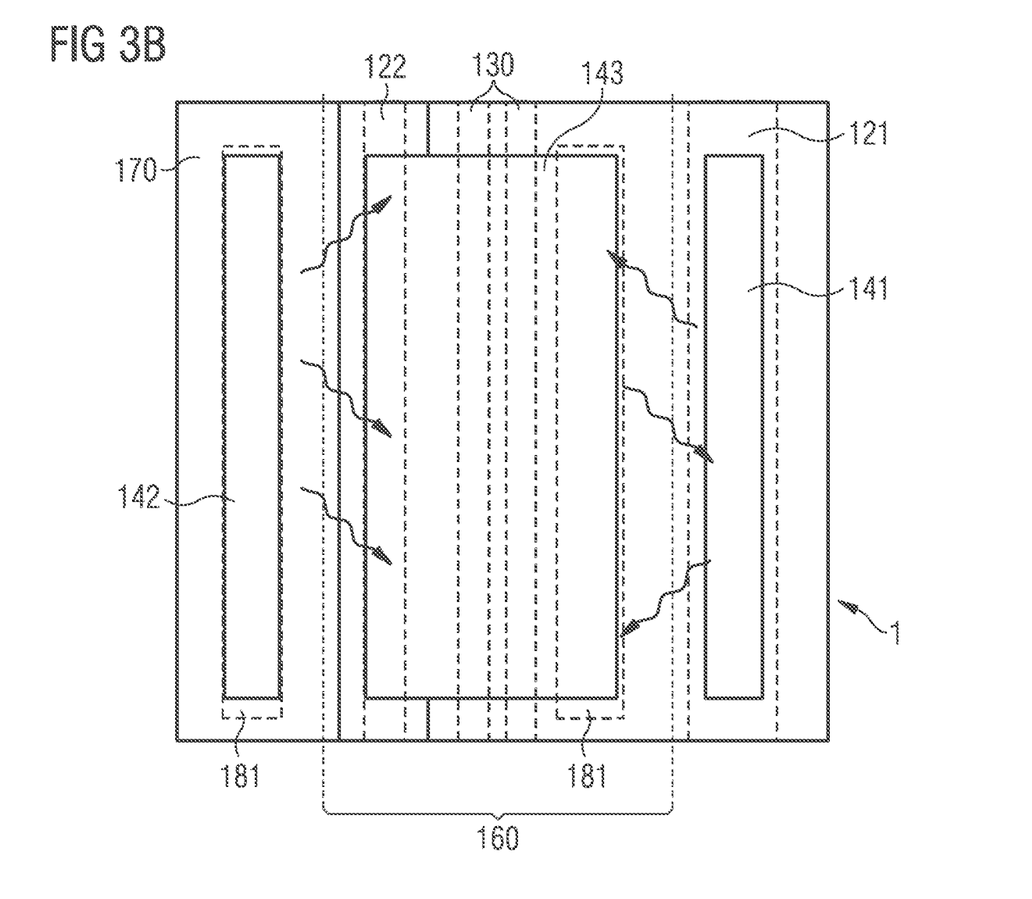

FIG. 3B shows a schematic representation of a top view of the bottom side of an optoelectronic semiconductor component 1 according to the third exemplary embodiment. The scale in the lateral direction of FIG. 3A corresponds to the scale in the lateral direction of FIG. 3B. It shows the majority of shielding zones 130 which are not in contact with the electrical connection layer 143.

Figure 4A:
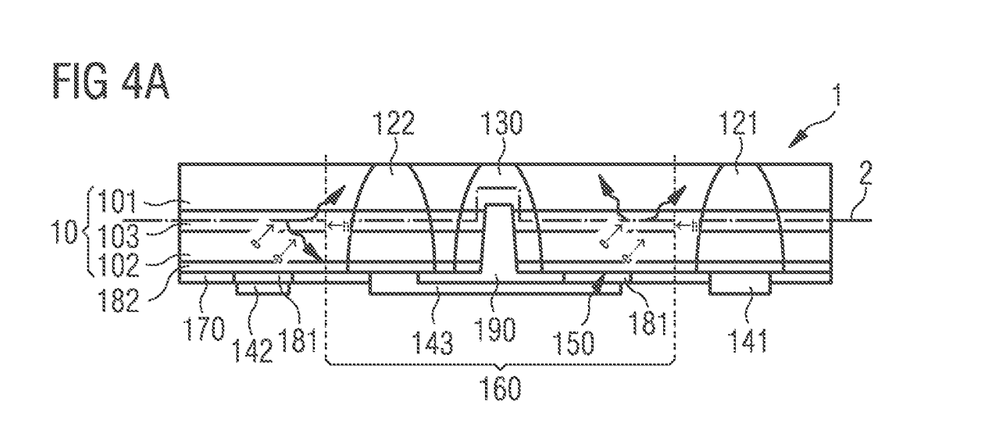

FIG. 4A shows a fourth exemplary embodiment of an optoelectronic semiconductor component 1 with a cut line 2. The fourth exemplary embodiment essentially corresponds to the second exemplary embodiment with the exception of a recess 190, which is placed inside the shielding zone 130 and which is filled with the material of the electrically insulating layer 170. The recess 190 extends from the second contact layer 182 into the first semiconductor layer and completely penetrates the active layer 103. With the material of the electrically insulating layer 170 contained therein, the recess 190 represents a refractive index jump within the semiconductor layer sequences 10, at which electromagnetic radiation can be reflected. The positive flank angle of the recess 190 and the resulting reflection at an interface running at an angle to the extraction surface favors the extraction of light and thus increases the efficiency of the optoelectronic semiconductor component 1. At the same time, the recess 190 improves the electrical insulation within the region 160 and can thus contribute to a reduction of the leakage currents within the semiconductor layer sequence 10 between the second contact zone 122 and the electrical connection region 150.

Figure 4B:
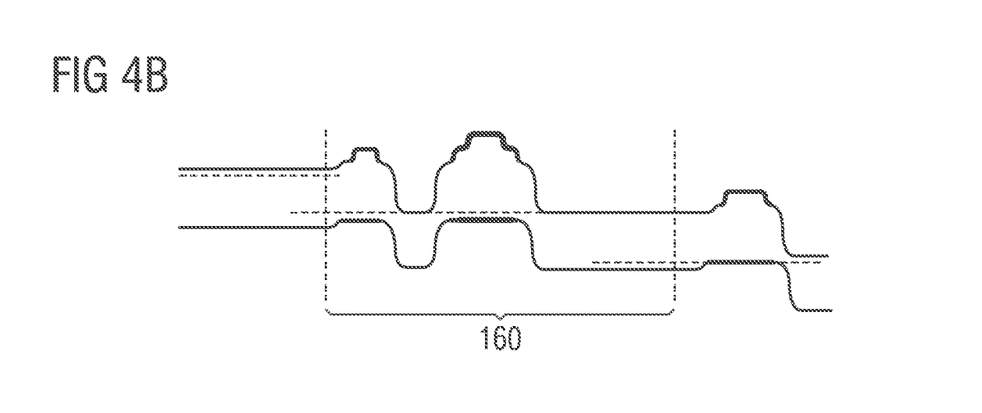

FIG. 4B shows a band edge of an optoelectronic semiconductor component 1 according to the fourth exemplary embodiment, measured at the cut line 2 shown in FIG. 4A. The scale in the lateral direction of FIG. 4A corresponds to the scale in the lateral direction of FIG. 4B. It can be seen that a further increase in the valence band edge occurs within recess 190, due to the recess 190. This can result in a further reduction in leakage currents.

Figure 5:
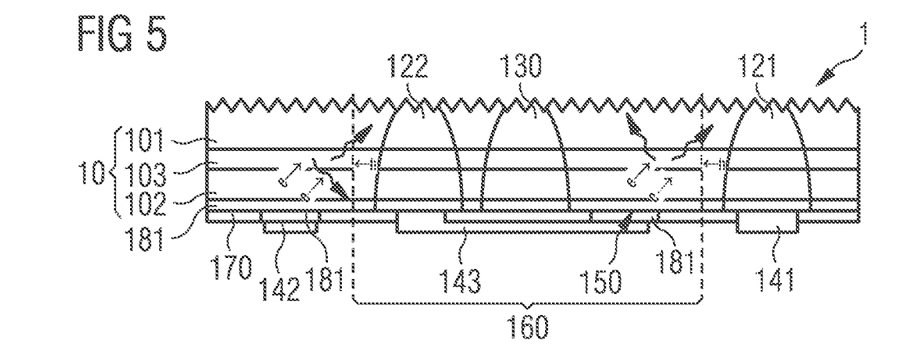

FIG. 5 shows a fifth exemplary embodiment of an optoelectronic semiconductor component 1. The fifth exemplary embodiment essentially corresponds to the second exemplary embodiment with a roughened surface on the side of the first semiconductor layer 101 remote from the active layer 103. A smooth surface favours the waveguide effect caused by total reflection. A roughening or structuring of this surface makes it possible to reduce the waveguide effect and thus enables a more efficient extraction of the electromagnetic radiation generated in the active layer 103.

Figure 6:
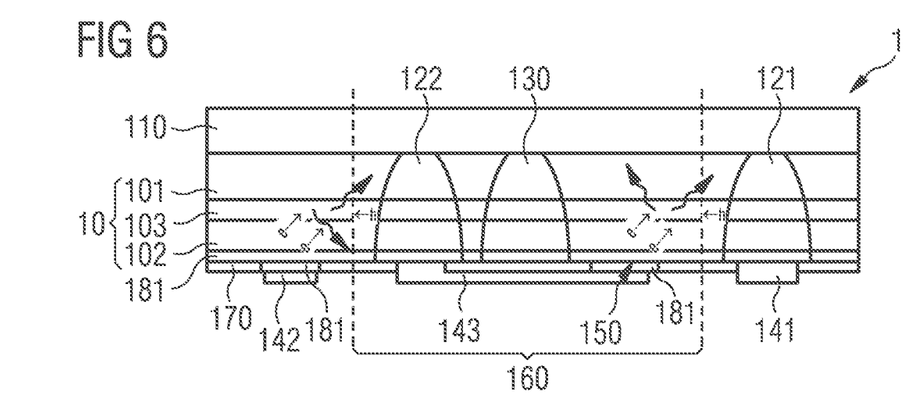

FIG. 6 shows a sixth exemplary embodiment of an optoelectronic semiconductor component 1. The sixth exemplary embodiment corresponds essentially to the second exemplary embodiment. A transparent carrier layer 110 is added on the side of the first semiconductor layer 101 remote from the active layer 103. The transparent carrier layer 110 can be formed, for example, with a sapphire or a glass and gives the optoelectronic semiconductor component 1 its mechanical stability and is translucent to the electromagnetic radiation generated in the active layer 103. The growth substrate, on which the semiconductor layer sequence was epitaxially grown, has been removed from the semiconductor layer sequence.

Figure 7:
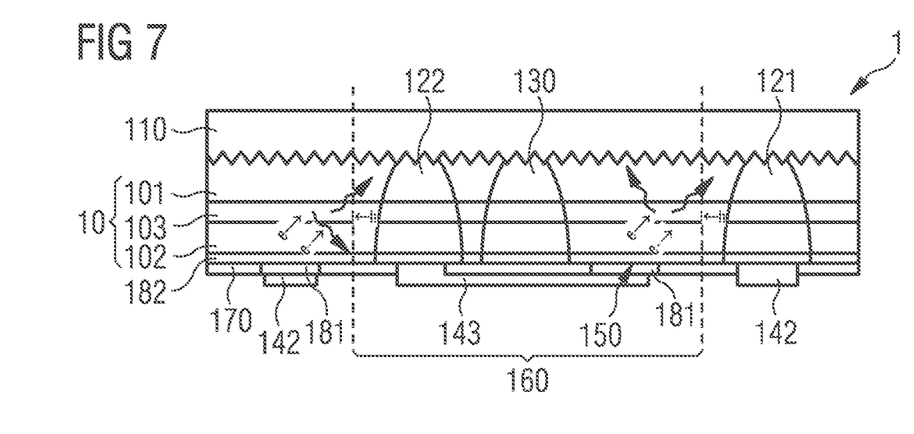

FIG. 7 shows a seventh exemplary embodiment of an optoelectronic semiconductor component 1. The seventh exemplary embodiment essentially corresponds to the sixth exemplary embodiment. A structuring of the interface between the first semiconductor layer 101 and the transparent carrier layer 110 is added. By roughening the interface, the extraction of electromagnetic radiation from the semiconductor layer sequence 10 is advantageously facilitated.

Figure 8:
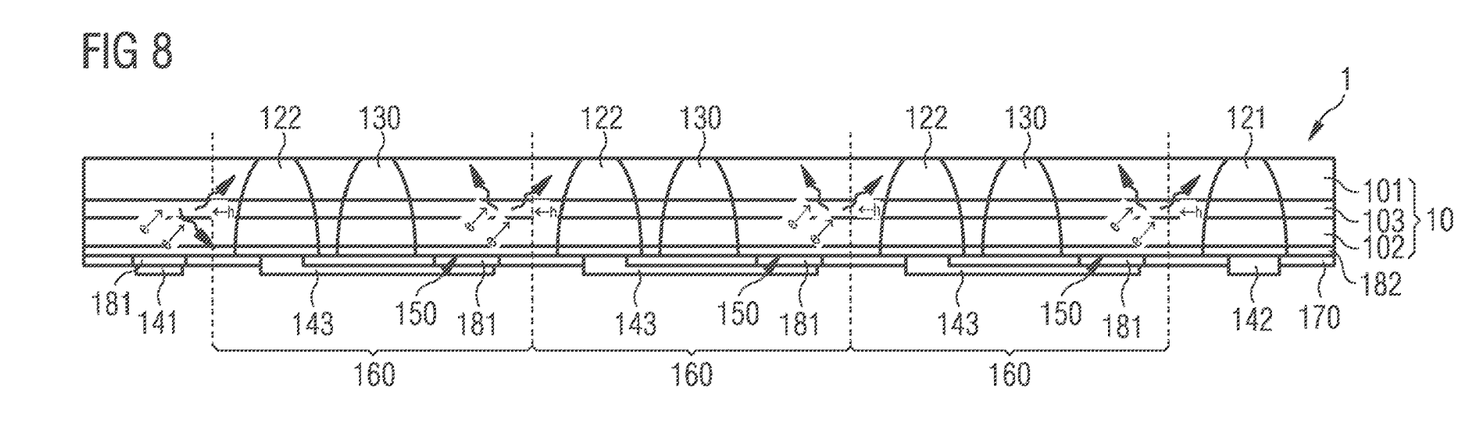

FIG. 8 shows an eighth exemplary embodiment of an optoelectronic semiconductor component. The eighth exemplary embodiment corresponds essentially to the second exemplary embodiment, but with a plurality of functional regions 160, which are arranged in a lateral sequence between the first electrical terminal layer 141 and the first contact zone 121. This results in a series connection of the laterally arranged functional regions 160 and thus a plurality of pn junctions and an increase in the supply voltage between the first electrical terminal layer 141 and the second electrical terminal layer 142.

Figure 9:
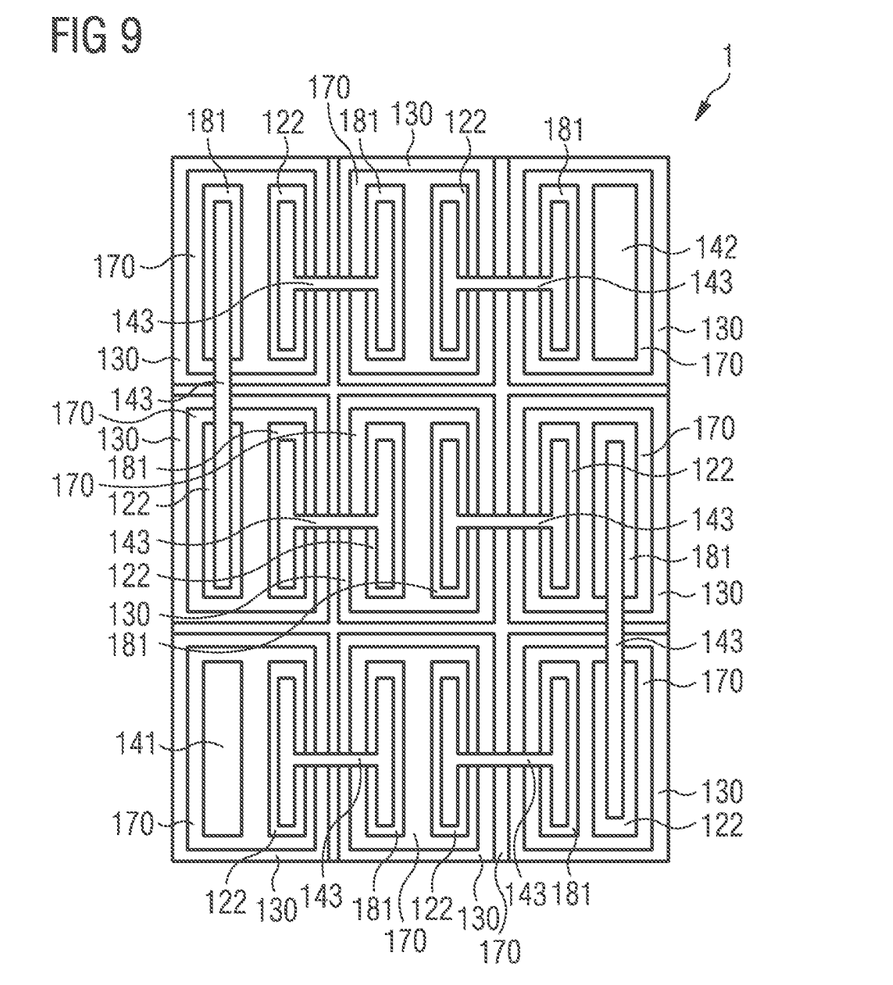

FIG. 9 shows a schematic diagram of a possible circuit layout of an optoelectronic semiconductor component 1 according to a ninth exemplary embodiment. The optoelectronic semiconductor component 1 comprises an electrically insulating layer 170, a first electrical terminal layer 141, a second electrical terminal layer 142, a plurality of second contact zones 122, a plurality of shielding zones 130, and a plurality of electrical connection layers 143. Each pn junction is completely surrounded by a shielding zone 130 and thus electrically insulated from the adjacent pn junctions. The electrical connection layers 143 form a conductive path between the pn junctions. With the arrangement shown, a series connection of, for example, nine pn junctions can be achieved with a minimal space requirement.

The invention is not limited by the description based on the exemplary embodiments. Rather, the invention comprises every new feature as well as every combination of features, which in particular includes every combination of features in the claims, even if this feature or combination itself is not explicitly stated in the claims or examplary embodiments.

This patent application claims the priority of the German patent application 102017126446.9, the disclosure content of which is hereby incorporated by reference.

LIST OF REFERENCE SIGNS 1 optoelectronic semiconductor component
2 cut line
10 semiconductor layer sequence
101 first semiconductor layer
102 second semiconductor layer
103 active layer
110 transparent carrier
121 first contact zone
122 second contact zone
130 shielding zone
141 first electrical terminal layer 142 second electrical terminal layer
143 electrical connection layer
150 electrical connection region
160 functional region
170 electrically insulating layer
181 first contact layer
182 second contact layer
190 recess

The invention claimed is:

1. An optoelectronic semiconductor component having
a semiconductor layer sequence comprising a first semiconductor layer of a first conductivity type, a second semiconductor layer of the first conductivity type and an active layer designed for generating electromagnetic radiation, wherein the active layer is disposed between the first semiconductor layer and the second semiconductor layer,
a first electrical terminal layer and a second electrical terminal layer laterally spaced from the first electrical terminal layer and electrically contacting the active layer,
a first contact zone of a second conductivity type adjacent to the first electrical terminal layer and electrically conductively connected to the first electrical terminal layer,
at least one functional region formed between the first electrical terminal layer and the second electrical terminal layer, in which a second contact zone of a second conductivity type and at least one shielding zone of a second conductivity type are formed, wherein
the second contact zone adjoins an electrical connection layer and is electrically conductively connected to the electrical connection layer,
the electrical connection layer extends outside the semiconductor layer sequence and contacts the second semiconductor layer (102) in an electrical connection region, and
the shielding zone is disposed between the second contact zone and the electrical connection region and is electrically insulated from the electrical connection layer, and
the first contact zone, the second contact zone and the shielding zone extend from the second semiconductor layer to the first semiconductor layer and penetrate completely through the active layer.

2. The optoelectronic semiconductor component according to claim 1, in which the shielding zone reduces a flow of charge carriers within the semiconductor layer sequence in the lateral direction.

3. The optoelectronic semiconductor component according to claim 1, in which a lightly doped second contact layer of the first conductivity type is arranged between the second semiconductor layer and the first electrical terminal layer and/or between the second semiconductor layer and the electrical connection layer.

4. The optoelectronic semiconductor component according to claim 1, in which at least one semiconductor layer of the semiconductor layer sequence is based on a phosphide compound semiconductor material.

5. The optoelectronic semiconductor component according to claim 1, in which at least one semiconductor layer of the semiconductor layer sequence is based on an arsenide compound semiconductor material.

6. The optoelectronic semiconductor component according to claim 1, in which the first conductivity type is produced by n-doping with silicon, tellurium and/or tin.

7. The optoelectronic semiconductor component according to claim 1, in which the second conductivity type is produced by p-doping with magnesium and/or zinc.

8. The optoelectronic semiconductor component according to claim 1, in which the side of the first semiconductor layer remote from the active layer has a roughened or structured surface.

9. The optoelectronic semiconductor component according to claim 1, in which the side of the first semiconductor layer remote from the active layer is free from electrical terminal layers.

10. The optoelectronic semiconductor component according to claim 1, in which a recess extends from the second semiconductor layer in the direction of the first semiconductor layer,
which completely penetrates the active layer,
which is arranged between the second contact zone and the electrical connection region, and
which is filled with a dielectric.

11. The optoelectronic semiconductor component according to claim 10, in which the recess is arranged completely within a shielding zone.

12. The optoelectronic semiconductor component according to claim 10, in which a plurality of recesses are arranged in the lateral direction between the second contact zone and the electrical connection region.

13. The optoelectronic semiconductor component according to claim 12, in which a plurality of shielding zones are formed within a functional region.

14. The optoelectronic semiconductor component according to claim 1, in which a plurality of functional regions according to one of the preceding claims are formed in lateral sequence between the first electrical terminal layer and the second electrical terminal layer.

15. A method for producing an optoelectronic semiconductor component comprising the following steps:
A) providing a growth substrate,
B) growing a semiconductor layer sequence comprising a first semiconductor layer, a second semiconductor layer and an active layer designed for generating electromagnetic radiation,
C) introducing a first contact zone, a second contact zone and at least one shielding zone into the semiconductor layer sequence,
D) arranging an electrically insulating layer on the side of the second semiconductor layer remote from the active layer,
E) arranging a first electrical terminal layer, a second electrical terminal layer and an electrical connection layer on the side of the electrically insulating layer remote from the active layer,
F) roughening the side of the first semiconductor layer remote from the active layer.

16. The method for producing an optoelectronic semiconductor component according to claim 15, wherein step C) is carried out only after step B).

17. The method for producing an optoelectronic semiconductor component according to claim 15, in which the semiconductor layer sequence is applied to a carrier on a side remote from the growth substrate and the growth substrate is detached.

* * * * *

UNITED STATES PATENT AND TRADEMARK OFFICE
CERTIFICATE OF CORRECTION

PATENT NO. : 11,145,783 B2  
APPLICATION NO. : 16/762272  
DATED : October 12, 2021  
INVENTOR(S) : Petrus Sundgren Page 1 of 1

It is certified that error appears in the above-identified patent and that said Letters Patent is hereby corrected as shown below:

In the Claims

At Column 11, Line 37, "(102)" should be removed from Claim 1

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*